(12) United States Patent
Oh

(10) Patent No.: US 11,449,382 B2
(45) Date of Patent: Sep. 20, 2022

(54) MEMORY SYSTEMS COMPRISING NON-VOLATILE MEMORY DEVICES

(71) Applicant: Samsung Electronics Co., Ltd., Suwon-si (KR)

(72) Inventor: Hee-Tai Oh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 512 days.

(21) Appl. No.: 16/558,866

(22) Filed: Sep. 3, 2019

(65) Prior Publication Data

US 2020/0233739 A1    Jul. 23, 2020

(30) Foreign Application Priority Data

Jan. 22, 2019    (KR) .................. 10-2019-0007946

(51) Int. Cl.
  *G06F 11/07*    (2006.01)
  *G06F 3/06*     (2006.01)
  (Continued)

(52) U.S. Cl.
  CPC ........ *G06F 11/0793* (2013.01); *G06F 3/0679* (2013.01); *G06F 11/0751* (2013.01);
  (Continued)

(58) Field of Classification Search
  CPC ............... G06F 11/0793; G06F 3/0679; G06F 11/0751; G06F 11/2023; G06F 12/0246;
  (Continued)

(56) References Cited

U.S. PATENT DOCUMENTS 8,661,301 B1   2/2014  Yen
9,378,137 B2   6/2016  Kim et al.
(Continued)

OTHER PUBLICATIONS

Y.-M. Chang et al., "An Efficient Sudden-Power-Off-Recovery Design with Guaranteed Booting Time for Solid State Drives," 2016 IEEE 8th International Memory Workshop (IMW), 2016, pp. 1-4, (Year: 2016).*

*Primary Examiner* — Cynthia Britt
(74) *Attorney, Agent, or Firm* — Harness, Dickey & Pierce, P.L.C.

(57) ABSTRACT

A memory system includes a non-volatile memory device and controller circuitry. The non-volatile memory device includes an array of memory cells that includes memory blocks and pages. Each separate memory block includes a separate, respective set of one or more pages. The controller circuitry is configured to control an operation of the non-volatile memory device. The controller circuitry includes processing circuitry configured to perform a recovery operation for the non-volatile memory device in response to a determination that a specific event has occurred at the memory system during a program operation of the non-volatile memory device. The recovery operation includes determining status information associated with a first group including at least one page, determining a quantity of a set of pages included in a second group based on the status information, and programming dummy data for one or more pages of the set of pages included in the second group.

20 Claims, 19 Drawing Sheets

(51) Int. Cl.
*G11C 29/44* (2006.01)
*G06F 11/20* (2006.01)
*G06F 12/02* (2006.01)
*G11C 16/34* (2006.01)

(52) U.S. Cl.
CPC ...... *G06F 11/2023* (2013.01); *G06F 12/0246* (2013.01); *G11C 16/34* (2013.01); *G11C 16/3436* (2013.01); *G11C 29/44* (2013.01); *G06F 2212/608* (2013.01)

(58) Field of Classification Search
CPC ........... G06F 2212/608; G06F 11/1048; G06F 2212/7209; G06F 3/0629; G06F 3/0656; G06F 3/0614; G06F 3/064; G06F 3/0653; G06F 3/0658; G06F 11/2017
See application file for complete search history.

(56) References Cited

U.S. PATENT DOCUMENTS

| | | |
|---|---|---|
| 9,431,069 B2 | 8/2016 | Lim et al. |
| 9,478,271 B2 | 10/2016 | Chen et al. |
| 9,728,278 B2 | 8/2017 | Muchherla et al. |
| 10,061,512 B2 | 8/2018 | Lin |
| 10,776,264 B2 * | 9/2020 | Lin ...................... G06F 3/0679 |
| 2015/0095558 A1 * | 4/2015 | Kim ...................... G11C 16/30 |
| | | 711/103 |
| 2015/0127887 A1 | 5/2015 | Kim et al. |
| 2017/0169883 A1 * | 6/2017 | Kwon ...................... G11C 16/08 |
| 2018/0081551 A1 * | 3/2018 | Lee ...................... G06F 3/0604 |
| 2018/0225185 A1 | 8/2018 | Son |
| 2019/0198116 A1 * | 6/2019 | Lee ...................... G11C 16/10 |
| 2019/0325951 A1 * | 10/2019 | Kim ...................... G11C 8/14 |
| 2019/0354288 A1 * | 11/2019 | Jun ...................... G06F 3/0688 |

* cited by examiner

FIG. 3

| Status Information | Number of Pages |
|---|---|
| INF_Status (1) | 1 |
| INF_Status (2) | 3 |
| INF_Status (3) | 5 |
| INF_Status (4) | 7 |
| INF_Status (5) | None (Bad Block) |

FIG. 5A

| Erase Count | Status Information |
|---|---|
| ~ 1k | INF_Status (1) |
| 1k ~ 2k | INF_Status (2) |
| 2k ~ 3k | INF_Status (3) |
| 3k ~ 4k | INF_Status (4) |
| 4k ~ | INF_Status (5) |

FIG. 5B

| Read Count | Status Information |
|---|---|
| ~ 5k | INF_Status (1) |
| 5k ~ 8k | INF_Status (2) |
| 8k ~ 11k | INF_Status (3) |
| 11k ~ 14k | INF_Status (4) |
| 14k ~ | INF_Status (5) |

FIG. 6B

| LPA | PPA | DATA (VD/IVD) |
|---|---|---|
| LPA_100 | PPA_200 | DT_100 (VD) |
| LPA_101 | PPA_201 | DT_101 (VD) |
| LPA_102 | PPA_202 | DT_102 (VD) |
| LPA_103 | PPA_203 | DT_44 (IVD) |
| LPA_104 | PPA_204 | DT_45 (IVD) |
| LPA_105 | PPA_205 | |
| LPA_106 | PPA_206 | |
| LPA_107 | PPA_207 | |

FIG. 9

| Status Information | Verify Voltage Level of Dummy Data Program |
|---|---|
| INF_Status (1) | Vvrf_1 |
| INF_Status (2) | Vvrf_2 |
| INF_Status (3) | Vvrf_3 |
| INF_Status (4) | Vvrf_4 |
| INF_Status (5) | None (Bad Block) |

MEMORY SYSTEMS COMPRISING NON-VOLATILE MEMORY DEVICES

CROSS-REFERENCE TO RELATED APPLICATION

This application claims priority from Korean Patent Application No. 10-2019-0007946 filed on Jan. 22, 2019 in the Korean Intellectual Property Office, and all the benefits accruing therefrom under 35 U.S.C. 119, the contents of which in its entirety are herein incorporated by reference.

BACKGROUND

1. Technical Field

The present disclosure relates to memory systems, and more particularly to memory systems including one or more non-volatile memory devices.

2. Description of the Related Art

Memory systems may be configured to store data provided from one or more external devices in response to a write request received from the one or more external devices. In some cases, memory systems may be configured to provide stored data to one or more external devices in response to a read request received from the one or more external devices. An external device may be an electronic device configured to process data, and may include a computer, a digital camera, a mobile phone or the like. A memory system may be configured to operate while being built in (e.g., incorporated into, included in, or the like) an external device, and/or may be manufactured in a detachable form and may be configured to operate based on being detachably ("reversibly") or irreversibly connected to an external device.

Memory systems using one or more memory devices may be advantageous in that such memory systems have excellent stability and durability and exhibit high information access speed and low power consumption because they have no mechanical driving parts. Examples of such memory systems having such advantages include universal serial bus (USB) memory devices, memory cards having various interfaces, universal flash storage (UFS) devices, and solid state drives (SSD).

SUMMARY

Aspects of the present disclosure provide a memory system which improves data reliability and prolongs its life time.

According to some example embodiments of the present disclosure, a memory system may include a non-volatile memory device and controller circuitry. The non-volatile memory device may include an array of memory cells. The array may include a plurality of memory blocks and a plurality of pages. Each separate memory block of the plurality of memory blocks may include a separate, respective set of one or more pages of the plurality of pages. The controller circuitry may be configured to control an operation of the non-volatile memory device. The controller circuitry may include processing circuitry configured to perform a recovery operation for the non-volatile memory device in response to a determination that a specific event has occurred at the memory system during a program operation of the non-volatile memory device. The performing a recovery operation may include determining status information associated with a first group including at least one page of the plurality of pages, determining a quantity of a particular set of pages, of the plurality of pages, included in a second group based on the status information associated with the first group, and programming dummy data for one or more pages, of the particular set of pages included in the second group.

According to some example embodiments of the present disclosure, a memory system may include a non-volatile memory device and controller circuitry. The non-volatile memory device may include an array of memory cells. The array may include a plurality of memory blocks and a plurality of pages. Each separate memory block of the plurality of memory blocks may include a separate, respective set of one or more pages of the plurality of pages. The controller circuitry may be configured to control an operation of the non-volatile memory device. The controller circuitry may include processing circuitry configured to perform a recovery operation for the non-volatile memory device in response to a determination that a sudden power off (SPO) occurs during a program operation of the non-volatile memory device. The performing a recovery operation may include determining status information associated with a first group including at least one page of the plurality of pages, determining a program condition associated with dummy data to be programmed in a second group based on the status information associated with the first group, and programming the dummy data in one or more pages included in the second group based on the program condition.

According to some example embodiments of the present disclosure, a memory system may include a non-volatile memory device and controller circuitry. The non-volatile memory device may include an array of memory cells. The array may include a plurality of memory blocks and a plurality of pages. Each separate memory block of the plurality of memory blocks may include a separate, respective set of one or more pages of the plurality of pages. The controller circuitry may be configured to control an operation of the non-volatile memory device. The controller circuitry may include processing circuitry configured to perform a recovery operation based on programming dummy data in a first group including at least one page of the plurality of pages, based on status information of a target group, in response to a determination that a sudden power off (SPO) occurs during a program operation of the non-volatile memory device. The performing a recovery operation may include determining the target group or the third group based on arrangement information associated with each page of the plurality of pages arranged on a semiconductor chip of the non-volatile memory device.

However, aspects of the present disclosure are not restricted to the example embodiments set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail some example embodiments thereof with reference to the attached drawings, in which:

FIG. 3 is a diagram illustrating some example embodiments in which the number ("quantity") of pages to which dummy data is to be programmed is determined based on status information;

FIG. 5A is a diagram illustrating some example embodiments in which status information is determined according to an erase count, and FIG. 5B is a diagram illustrating some example embodiments in which status information is determined according to a read count;

FIG. 6B shows an example mapping table illustrating some example embodiments in which status information is determined according to the number ("quantity") of pages including valid data in the case of FIG. 6A;

FIG. 9 is a diagram illustrating some example embodiments in which a verify voltage level of a dummy data program is determined based on status information;

DETAILED DESCRIPTION OF THE EMBODIMENTS

Figure 1:
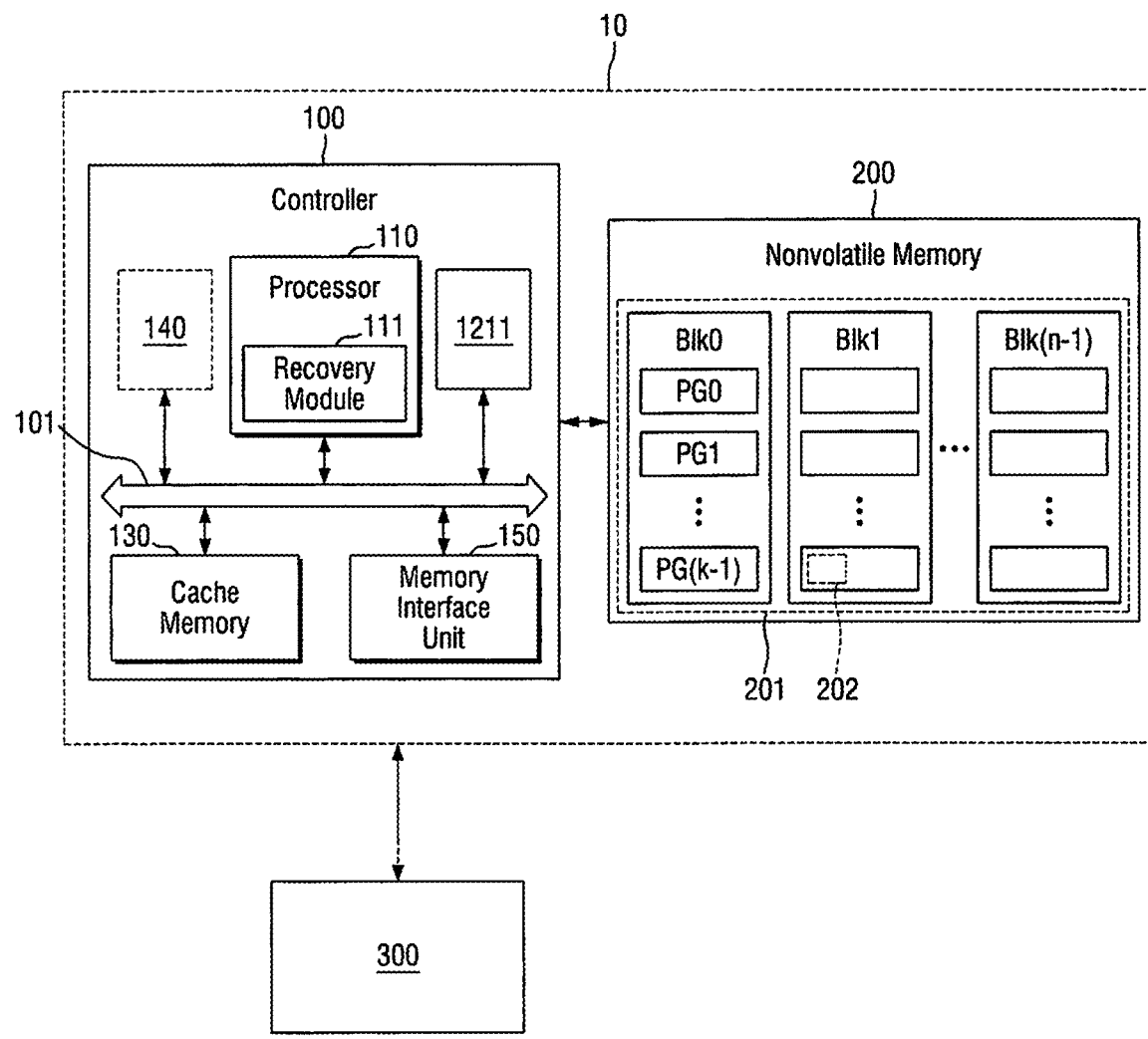
FIG. 1 is a block diagram briefly showing a configuration of a memory system according to some example embodiments of the present disclosure.

FIG. 1 is a block diagram briefly showing a configuration of a memory system according to some example embodiments of the present disclosure.

The memory system 10 may store data accessed by a host device 300 (see FIG. 7B) such as a mobile phone, an MP3 player, a laptop computer, a desktop computer, a game machine, a TV and an in-vehicle infotainment system.

The memory system 10, which may include one or more electronic devices, including one or more computing devices, may be manufactured as any one of various types of storage devices according to a host interface, which means a transport protocol with the host device 300. For example, the memory system 10 may be configured as any one of various types of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, a memory stick, and so forth.

The memory system 10 may be manufactured as any one among various types of package types. For example, the memory system 10 may be manufactured as any one of various types of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

Referring to FIG. 1, the memory system 10 in accordance with some example embodiments of the present disclosure may include a controller 100 and a non-volatile memory device 200. The controller 100, which may also be referred to as "controller circuitry", may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The controller 100 may perform an operation based on a request of the host device 300. For example, the controller 100 may receive a write request from the host device 300 and store the requested data in the non-volatile memory device 200. As another example, the controller 100 may receive a read request from the host device 300, read the requested data from the non-volatile memory device 200 and transmit it to the host device 300. In some example embodiments, the controller 100 performs a mapping between a logical address of the host device 300 and a physical address of the non-volatile memory device 200, and manages an address mapping table in which the mapping information is stored.

According to some example embodiments, the controller 100 may include a processor 110. According to some example embodiments, the controller 100 may include a cache memory 130. According to some example embodiments, the controller 100 may include a memory interface unit 150. According to some example embodiments, the controller 100 may include a host interface unit 1211. According to some example embodiments, the controller 100 may include a memory 140. According to some example embodiments, the elements included in the controller 100 may be electrically and/or communicatively coupled to each other via a bus 101.

The processor 110, which may also be referred to as "controller processor circuitry", may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 110 may include a micro control unit (MCU) or a central processing unit (CPU). The processor 110 may process a request transmitted from the host device 300. In order to process the request, the processor 110 may drive an instruction or algorithm of a code type, i.e., firmware (FW), loaded on the cache memory 130, and may control internal function blocks and the non-volatile memory device 200.

According to some example embodiments, the processor 110 may include a recovery module 111. Restated, the processor 110 may be configured to implement the functionality of the recovery module 111, for example based on executing a program of instructions stored on a memory device ("memory"), where such memory device may be included in the controller 100 (e.g., memory 140, also referred to herein as memory circuitry) and/or the non-volatile memory device 200. If a program operation of data is performed in the non-volatile memory device 200 when a specific event (e.g., SPO) occurs (e.g., in response to a determination that a specific event has occurred during a program operation of the non-volatile memory device 200, where the specific event may be an SPO event), the recovery module 111 may, in response, perform a recovery operation for the non-volatile memory device 200. The performing of the recovery operation, by the recovery module 111, may include selecting a first group under a particular (or, alternatively, predetermined) condition based on a reference page on which the program operation is performed, determine status information of the first group, selecting a second group based on the determined status information of the first group, and performing a program operation of dummy data on pages included in the selected second group. For example, to perform a recovery operation for the non-volatile memory device 200 in response to a determination that a specific event (e.g., SPO) has occurred at the memory system during a program operation of the non-volatile memory device 200, for example a SPO of the non-volatile memory device 200, the recovery module 111 may determine status information associated with a first group including at least one page of the plurality of pages, determine a quantity of pages, of the plurality of pages, included in a second group based on the status information associated with the first group, and program dummy data for one or more pages, of the plurality of pages included in the second group.

The term "dummy data program" as used herein refers to an operation of programming dummy data on a page, and the term "normal data program" as used herein refers to an operation of programming user data on a page, i.e., programming data requested from the host device 300 into a page of the non-volatile memory device 200. In some example embodiments, the dummy data may mean meaningless data.

The cache memory 130, also referred to herein as a cache memory device, cache memory circuitry, and/or cache storage device, may be a memory device, memory circuitry, and/or storage device and may include a random access memory such as a dynamic random access memory (DRAM) or a static random access memory (SRAM). The cache memory 130 may store firmware to be driven by the processor 110. In some example embodiments, the cache memory 130 may store data necessary for driving the firmware, for example, metadata. That is, the cache memory 130 may operate as a working memory of the processor 110.

The memory 140, also referred to herein as a memory device, memory circuitry, and/or storage device, may be a memory device, memory circuitry, and/or storage device and may include a random access memory such as a dynamic random access memory (DRAM) or a static random access memory (SRAM). The memory 140 may store a program of instructions, including firmware, to be driven ("executed") by the processor 110 to implement some or all functionality of the controller 100. In some example embodiments, the memory 140 may store data necessary for driving the program of instructions, for example, metadata. That is, the memory 140 may operate as a working memory of the processor 110.

The memory interface unit 150, also referred to herein as memory interface circuitry, may control the non-volatile memory device 200 according to control of the processor 110. The memory interface unit 150 may provide (e.g., generate and/or transmit) control signals to the non-volatile memory device 200. The control signals may include a command, an address, a control signal and so forth for controlling the non-volatile memory device 200. Accordingly, the memory interface unit 150 may provide control signals that, when received at the non-volatile memory device 200, cause the non-volatile memory device 200 to be controlled according to control of the processor 110. The memory interface unit 150 may provide data to the non-volatile memory device 200 or may receive data from the non-volatile memory device 200.

According to some example embodiments, the controller 100 may further include a host interface unit 1211, also referred to herein as host interface circuitry. The host interface unit may interface ("communicatively couple") the host device 300 and the memory system 10 to each other. For example, the host interface unit 1211 may communicate with the host device 300 by using a host interface, i.e., any one of standard transport protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS).

The non-volatile memory device 200, which may also be referred to as non-volatile memory circuitry, may include (e.g., may be configured to implement) a plurality of memory blocks BLK0 to BLK(n−1), and each of the memory blocks BLK0 to BLK(n−1) may include a plurality of pages PG0 to PG(k−1). From an operational viewpoint, or a physical or structural viewpoint, memory cells included in a memory cell region may be configured into a hierarchical memory cell set or a memory cell unit. For example, memory cells which are connected to the same word line and are to be read and programmed simultaneously may be configured as a page. For simplicity of description, the memory cells comprising a page will be referred to as a "page." Also, memory cells to be erased simultaneously may be configured as a memory block. It will be understood that the non-volatile memory device 200 will be understood to include an array 201 of memory cells 202, where the array 201 of memory cells 202 includes a plurality of memory blocks Blk0 to Blk(n−1) and a plurality of pages, each memory block of the plurality of memory blocks including a separate, respective set of one or more pages PG0 to PG(k−1) of the plurality of pages, where "n" and "k" are each a separate positive integer, where each memory block includes a separate, respective first set of one or more memory cells 202, of the array 201 of memory cells 202, that are configured to be erased simultaneously, and each page includes a separate, respective second set of one or more memory cells 202, of the array 201 of memory cells 202, that are connected to a same word line and are configured to be read and programmed simultaneously.

Figure 2:
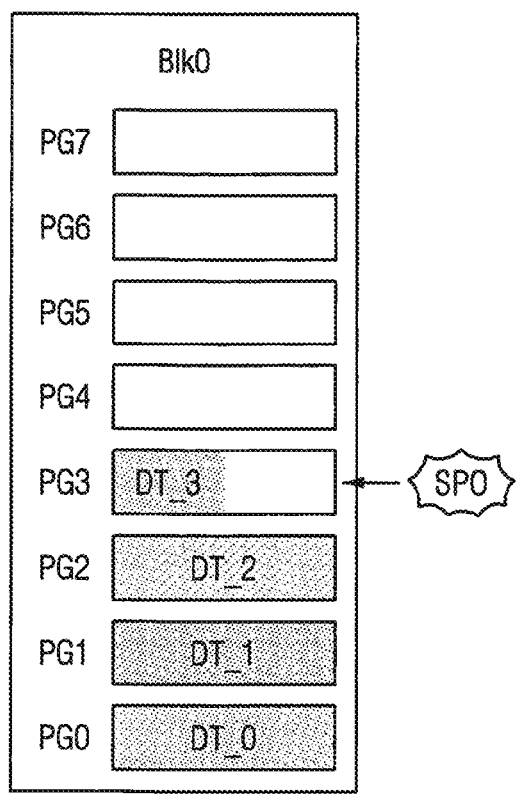
FIG. 2 is a diagram illustrating some example embodiments where a sudden power off (SPO) occurs in a non-volatile memory device.

FIG. 2 is a diagram illustrating some example embodiments where a sudden power off (SPO) occurs in a non-volatile memory device. For simplicity of description, it is assumed that each of the memory blocks of the non-volatile memory device 200 includes eight pages PG0 to PG7, and the order of the program operation is set in the order of a first page PG0 to an eighth page PG7.

During the operation of the memory system 10, a sudden power off (SPO), which is an abrupt power loss, may occur due to an unexpected power failure. When SPO occurs, external power supply to one or more elements of the memory system (e.g., controller 100 and/or the non-volatile memory device 200) is interrupted (external power off). However, the memory system 10 can be driven by auxiliary power stored in an auxiliary power device such as a super capacitor. While being driven by the auxiliary power, the memory system 10 may complete the operation being performed in the non-volatile memory device 200 and dump necessary data to a flash memory device. When the dump operation is completed, the memory system 10 may terminate all operations by cutting off internal power supply (internal power off).

Referring to FIGS. 1 and 2, it is assumed that an SPO has occurred during a program operation for data DT_3 in a fourth page PG3 of a first memory block. A general storage device (e.g., non-volatile memory device 200) allocates a new memory block without using the corresponding memory block any more when a specific event occurs during a program operation, stores user data in a newly allocated memory block and performs an erase operation on the previous memory block, thereby increasing the number ("quantity") of unnecessary erase operations due to the occurrence of a specific event. In some example embodiments, dummy data is stored in a page in which no data is stored among the plurality of pages included in the memory block in which the program operation is interrupted due to the SPO, or a memory block in which the SPO has occurred is set as a closed block to block the program operation to the remaining pages. Thus, the program operation is blocked without determining the status of an empty page because the SPO has occurred even though the empty page exists, thereby reducing the efficiency of a memory space in which the user data is stored.

In some example embodiments, the memory system 10 according to some example embodiments of the present disclosure may set a memory block in which a specific event has occurred as a closed block even if a specific event (e.g., SPO) occurs during the program operation, or continue to use the current memory block (e.g., the memory block being programmed at the time of occurrence of the SPO) after performing the dummy data program operation without allocating a new memory block after programming the dummy data to all the empty pages. That is, by dynamically determining the page on which the dummy data is to be programmed based on the status information of the selected group after the occurrence of the event, the program operation performed before the occurrence of the event may be continuously written to the corresponding memory block even after the occurrence of the event. In some example embodiments, by applying different program conditions of dummy data according to the degree of damage of the memory cells, it is possible to more efficiently utilize the storage space. The present disclosure can extend the life time of the non-volatile memory device 200 by reducing the number ("quantity") of unnecessary erase operations and reducing or minimizing wasted pages through continuous writing, thereby improving the operation and/or performance of a computing device that includes the non-volatile memory device.

In some example embodiments, some or all functionality of one or more elements of the memory system 10 may be implemented by processing circuitry, such as described herein with regard to the controller 100, based on executing a program of instructions that is stored on a memory device. Therefore, it will be understood that the memory system 10, in some example embodiments, may include a memory storing a program of instructions and processing circuitry configured to execute the program of instructions to implement some or all of the functionality of one or more elements of the memory system 10 as described herein.

In some example embodiments, some or all functionality of one or more elements of the controller 100 (e.g., the recovery module 111) may be implemented by processing circuitry, such as described herein with regard to the controller 100, based on executing a program of instructions that is stored on a memory device. Therefore, it will be understood that the controller 100, in some example embodiments, may include a memory 140 storing a program of instructions and processing circuitry (e.g., processing circuitry of process 110 as described herein) configured to execute the program of instructions to implement some or all of the functionality of one or more elements of the controller 100 as described herein (e.g., the functionality of the recovery module 111).

In some example embodiments, some or all functionality of one or more elements of the non-volatile memory device 200 may be implemented by processing circuitry, such as described herein with regard to the controller 100, based on executing a program of instructions that is stored on a memory device. Therefore, it will be understood that the non-volatile memory device 200, in some example embodiments, may include a memory storing a program of instructions and processing circuitry configured to execute the program of instructions to implement some or all of the functionality of one or more elements of the non-volatile memory device 200 as described herein.

FIG. 3 is a diagram illustrating some example embodiments in which the number ("quantity") of a particular set of pages, of the plurality of pages of the non-volatile memory device 200, to which dummy data is to be programmed is determined based on status information. The particular set of pages of which the quantity is determined may be an entirety of the pages included in the second group.

Referring to FIGS. 1 to 3, the recovery module 111 according to some example embodiments of the present disclosure, to perform a recovery operation for the non-volatile memory device 200 in response to a determination that a specific event (e.g., SPO) has occurred at the memory system 10 during a program operation of (e.g., performance of a program operation at, performance of a program operation by, etc.) the non-volatile memory device 200, may determine status information of ("associated with") a first group including at least one page, determine the number ("quantity") of pages of a particular set of pages, of the plurality of pages of the non-volatile memory device 200, included in a second group based on the status information of the first group, and perform a dummy data program operation on the particular set of pages included in the second group. Performing the dummy program operation of the particular set of pages may include programming dummy data for one or more pages of the particular set of pages. A page included in the first group may be a page on which determination of status information is performed, and a page included in the second group may be a page on which a dummy program operation is performed.

According to some example embodiments, the first group may be a page on which the program operation is to be performed after a reference page on which the program operation was performed when the SPO occurred. That is, when an SPO occurs during the program operation for the data DT_3 in the fourth page PG3, the fourth page PG3 becomes the reference page and the fifth page PG4, the sixth page PG5, the seventh page PG6, the eighth page PG7, or any combination thereof, may be selected as the first group. According to some example embodiments, the first group may be selected to include a page which is before the reference page in the program order. That is, the first page PG0, the second page PG1, the third page PG2, or any combination thereof, may be selected as the first group. In some example embodiments, both a page after the reference page and a page before the reference page may be selected as the first group.

According to some example embodiments, a page corresponding to a logical address within a particular (or, alternatively, predetermined) range may be selected as the first group based on the logical address of the reference page. Restated, to perform the recovery operation, the recovery module 111 may select, as the first group, a selected page, of the plurality of pages of the non-volatile memory device 200, corresponding to a logical address within a particular range based on a logical address of a reference page, of the plurality of pages of the non-volatile memory device 200, in which the program operation of the memory system 10 is interrupted due to the specific event (e.g., SPO). In general, in many cases, pages having consecutive logical addresses are arranged adjacent to each other, and thus, are highly likely to be affected by a specific event (e.g., SPO) occurring in each page. Therefore, the first group, which is a target of the status information determination, can be set to a particular (or, alternatively, predetermined) address range based on the reference page.

As shown, the number ("quantity") of pages corresponding to each of a plurality of pieces of status information may be set, and accordingly, the number ("quantity") of pages of the second group may be determined. In some example embodiments, the status information means the status information of the first group, and the number ("quantity") of pages means the number ("quantity") of pages included in the second group. In addition, the order in which the determined number ("quantity") of pages are selected may be set in advance. According to some example embodiments, pages included in the first group may overlap with pages included in the second group.

If it is determined that the first group has first status information INF_Status(1), a page included in the second group on which a dummy program operation is to be performed may be selected as one page. In some example embodiments, if it is determined that the first group has second to fourth status information INF_Status(2), INF_Status(3) and INF_Status(4), three, five and seven pages may be selected, respectively, as the second group. It may mean that the damage degree of the first group deteriorates as it goes from the first status information INF_Status(1) to the fourth status information INF_Status(4). Therefore, by determining the number ("quantity") of pages of the second group to which the dummy data is to be programmed as a relatively small value when the degree of damage is not severe (for example, when the status information of the first group is determined as the first status information INF_Status(1)), and determining the number ("quantity") of pages of the second group to which the dummy data is to be programmed as a relatively large value when the degree of damage is severe (for example, when the status information of the first group is determined as the fourth status information INF_Status(4)), depending on the status of the memory cells, the page to which continuous writing is applied can be flexibly selected and the efficiency of memory usage can be increased.

According to some example embodiments, when the degree of damage of the first group exceeds a particular (or, alternatively, predetermined) range, a reference memory block including a reference page may be set as a bad block without performing a dummy data program operation on the second group, and a program operation of data for the remaining pages of the reference memory block may be blocked. For example, when the status information of the first group is determined as fifth status information INF_Status(5), the recovery module 111 may not select the second group, and may set the reference memory block including the reference page in which the SPO has occurred as a bad block (or closed block).

According to some example embodiments, when the degree of damage of the first group exceeds the particular (or, alternatively, predetermined) range, a dummy data program operation may be performed on all the empty pages of the reference memory block including the reference page. For example, when SPO occurs during the program operation for the fourth page PG3 of FIG. 2 and the status information of the selected first group is the fifth status information INF_Status(5), the recovery module 111 may perform a dummy data program operation on the fifth to eighth pages PG4 to PG7, and may set the memory block BLK0 as a bad block.

The configurations and operations described above with reference to FIGS. 1 to 3 can be applied in the same manner to embodiments to be described with reference to FIGS. 4A to 8.

Figure 4A:
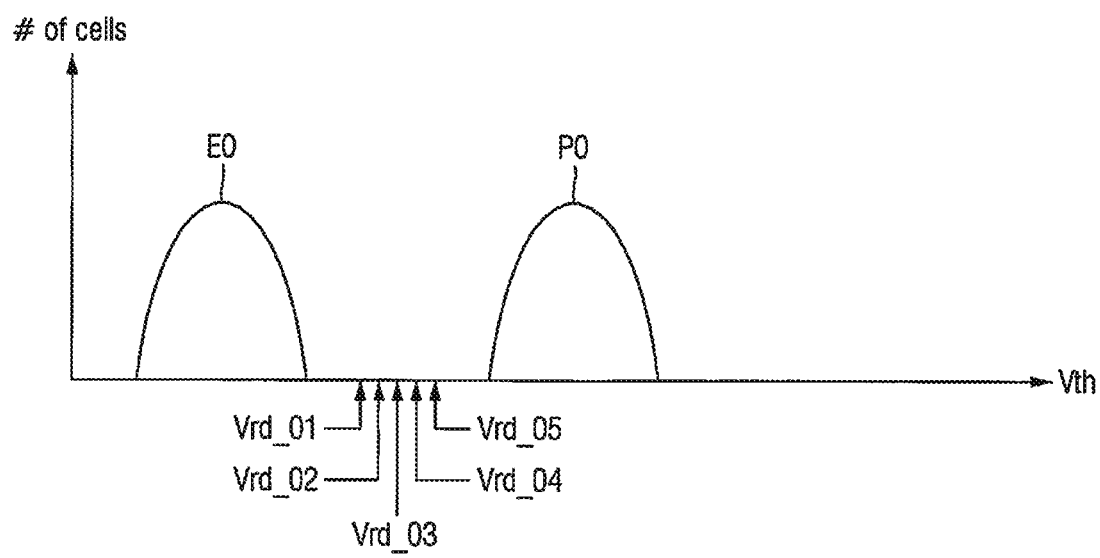
FIGS. 4A and 4B are diagrams illustrating some example embodiments in which status information is determined based on the number ("quantity") of memory cells obtained in accordance with a plurality of read voltages.
Figure 4B:
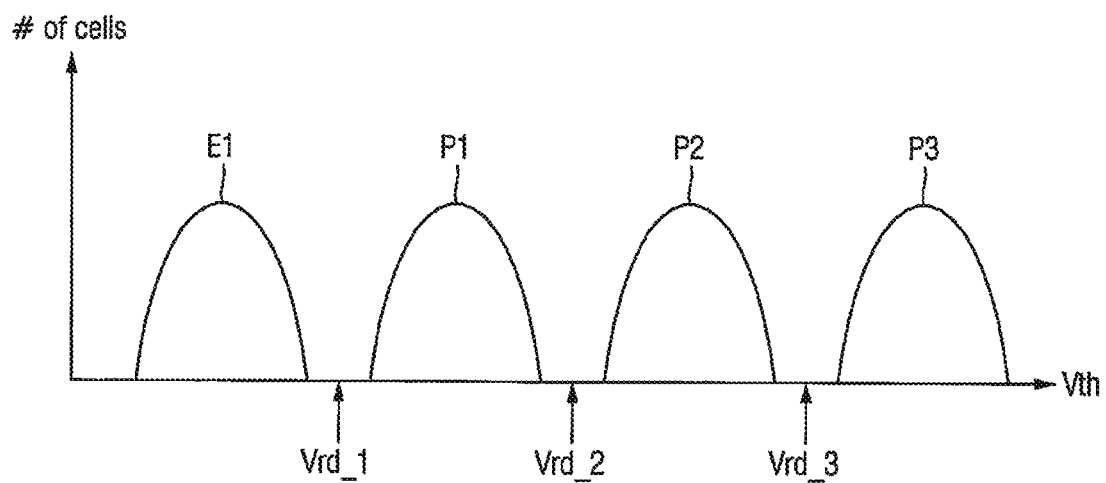

FIGS. 4A and 4B are diagrams illustrating some example embodiments in which the status information of the first group is determined based on information obtained by applying at least one read voltage.

Referring to FIG. 4A, the non-volatile memory device 200 according to some example embodiments of the present disclosure may be implemented as a single level cell (SLC) which stores 1 bit per memory cell. Thus, threshold voltage distribution of the memory cells may appear as illustrated. That is, it is classified into an erase state E0 in which a bit of "1" is stored in a memory cell and a program state P0 in which a bit of "0" is stored in a memory cell. A read operation of data may be performed by determining the bit obtained by applying the read voltage. For example, when a particular (or, alternatively, predetermined) read voltage is a read voltage Vrd_03, the read voltage Vrd_03 is applied to the memory cells of the target page, and when the read voltage Vrd_03 is applied, the memory cells having the erase state E0 are turned on and the memory cells having the program state P0 are turned off. By sensing this condition, it may be determined whether the bit value stored in the memory cells of the target page is 0 or 1. That is, when the read voltage Vrd_03 is applied, the bit stored in the memory cell is 1 if the memory cell is turned on, and the bit stored in the memory cell is 0 if the memory cell is turned off.

The recovery module 111 according to some example embodiments of the present disclosure may determine the status information of the first group using a plurality of read voltages each having a different voltage level. According to some example embodiments, first cell information may be obtained by applying a read voltage Vrd_01, and second cell information may be obtained by applying a read voltage Vrd_02. Similarly, third cell information, fourth cell information and fifth cell information may be obtained, respectively, by applying a read voltage Vrd_03, a read voltage Vrd_04 and a read voltage Vrd_05. The recovery module 111 may determine the threshold voltage distribution of the particular set of memory cells included in the pages of the first group based on the first to fifth cell information and determine the status information of the first group based thereon.

Referring to FIG. 4B, the non-volatile memory device 200 according to some example embodiments of the present disclosure may be implemented as a multi level cell (MLC) storing two or more bits per memory cell. For simplicity of description, some example embodiments where 2 bits are stored per memory cell has been illustrated, but the present disclosure is not limited thereto. The present disclosure is also applicable to the non-volatile memory device 200 in which 3 bits or more are stored per memory cell.

When 2 bits are stored per memory cell, a low-order bit and a high-order bit may be stored in each memory cell. It may be classified into an erase state E1 in which bits of "1, 1" are stored in the memory cell, a first program state P1 in which "1, 0" is stored in the memory cell, a second program state P2 in which "0, 0" is stored in the memory cell, and a third program state P3 in which "0, 1" is stored in the memory cell in the order of the low-order bit and the high-order bit. When storing 2 bits per memory cell, a read voltage Vrd_2 may be used to know a value of the low-order bit, and a read voltage Vrd_1 and a read voltage Vrd_3 may be used to know a value of the high-order bit.

When the read voltage Vrd_2 is applied, the memory cells having the erase state E1 and the program state P1 are turned on and the memory cells having the program state P2 and the program state P3 are turned off. By sensing this condition, it may be determined whether the value of the low-order bit of the memory cell is 0 or 1. That is, when the read voltage Vrd_2 is applied, the low-order bit value of the memory cell is 1 if the memory cell is turned on, and the low-order bit value of the memory cell is 0 if the memory cell is turned off. The read voltage Vrd_1 and the read voltage Vrd_3 may be used to know the value of the high-order bit. If the turn-on/turn-off state of the memory cell when applying the read voltage Vrd_1 is the same as the turn-on/turn-off state of the memory cell when applying the read voltage Vrd_3, the high-order bit of the data stored in the memory cell is 1, and if the turn-on/turn-off states are different from each other, the high-order bit stored in the memory cell is 0.

The operation of determining the status information of the first group using a plurality of read voltages each having a different voltage level, which is described above with reference to FIG. 4A, can be also applied to some example embodiments where 2 or more bits are stored per memory cell. That is, the status information of the group may be determined by dividing each of the read voltage Vrd_1, the read voltage Vrd_2 and the read voltage Vrd_3 shown in FIG. 4B into voltages having a plurality of different levels and applying each divided lead voltage.

In summary, the recovery module 111 according to some example embodiments of the present disclosure may apply a plurality of read voltages to each word line included in the first group, determine a threshold voltage distribution for the first group based on the information obtained according to the respective lead voltages, and determine the status information of the first group based on the determined threshold voltage distribution. Restated, to perform the recovery operation, the recovery module 111 may apply at least one read voltage to each page, of the plurality of pages, included in the first group, determine a threshold voltage distribution associated with a memory cell, of the array of memory cells, included in the first group based on information obtained based on applying the read voltage, and determine the status information associated with the first group based on the threshold voltage distribution associated with the memory cell.

FIG. 5A is a diagram illustrating some example embodiments in which status information is determined according to an erase count. FIG. 5B is a diagram illustrating some example embodiments in which status information is determined according to a read count.

The recovery module 111 according to some example embodiments of the present disclosure may determine the status information of the first group based on the erase count of the first group (e.g., the erase count of a particular memory block, of the plurality of memory blocks, included in the first group), the read count of the first group (e.g., the read count of the particular memory block including the first group), or both the erase count and the read count. The non-volatile memory device 200 has a finite life time, and the storage performance of the memory cell may be reduced depending on the frequency of use and the number ("quantity") of times of use. As the storage performance of the memory cell decreases, the threshold voltage distribution of the memory cell may be deformed, and in some example embodiments, it may be greatly affected by an event such as SPO.

Referring to FIG. 5A, the status information of the first group may be determined based on the erase count of the memory block including the first group. As shown in the figure, when the erase count of the memory block including the first group is 1000 or less, it may be determined as the first status information INF_Status(1), and when the erase count is between 2000 and 3000, it may be determined as the third status information INF_Status(3). When the erase count is between 3000 and 4000, it may be determined as the fourth status information INF_Status(4), and when the erase count is 4000 or more, it may be determined as the fifth status information INF_Status(5). According to the determined status information, the number ("quantity") of pages of the second group may be determined as described with reference to FIG. 3.

Referring to FIG. 5B, the status information of the first group may be determined based on the read count of the memory block including the first group. As another example, the status information of the first group may be determined based on the read count of the pages included in the first group. Hereinafter, some example embodiments in which the status information of the first group is determined based on the read count of the memory block including the first group will be described. As shown in the figure, when the read count of the memory block including the first group is 5000 or less, it may be determined as the first status information INF_Status(1), and when the read count is between 5000 and 8000, it may be determined as the second status information INF_Status(2). When the read count of the memory block is between 8000 and 11000, it may be determined as the third status information INF_Status(3), when the read count is between 11000 and 14000, it may be determined as the fourth status information INF_Status(4), and when the read count is 14000 or more, it may be determined as the fifth status information INF_Status(5). In addition, the number ("quantity") of pages of the second group may be determined according to the determined status information of the first group.

According to some example embodiments, the information on the erase count or the read count of the first group may be stored in the non-volatile memory. The non-volatile memory device 200 may include a main area and a meta area, and the information on the erase count or the read count may be stored in the meta area. The controller 100 may read information about the erase count or the read count stored in the meta area of the non-volatile memory device 200 through the memory interface unit 150, and the recovery module 111 may determine the status information for the first group based thereon.

According to some example embodiments, the information on the erase count or the read count of the first group may be stored in the cache memory 130 in the controller 100. In some example embodiments, the information stored in the cache memory 130 may be data read from the non-volatile memory. The recovery module 111 may determine the status information for the first group based on the erase count or the read count stored in the cache memory 130.

Figure 6A:
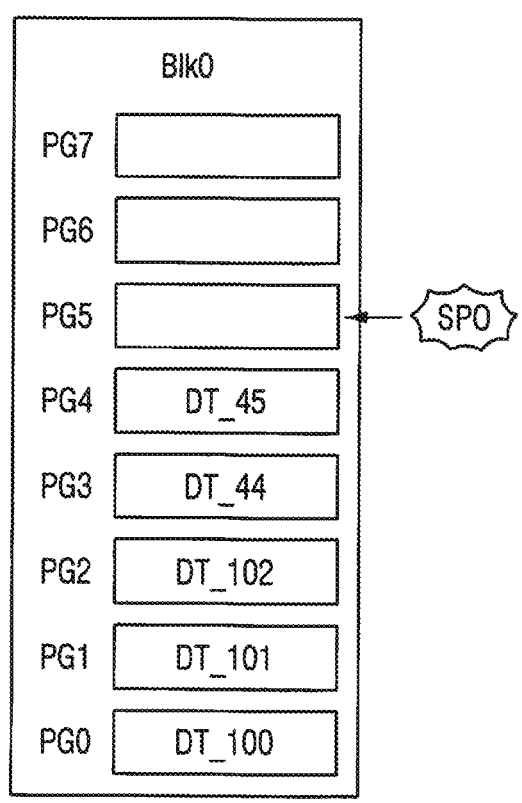
FIG. 6A is a diagram illustrating some example embodiments where an SPO occurs in a memory block of a non-volatile memory device.

FIG. 6A is a diagram illustrating some example embodiments where an SPO occurs in a memory block of a non-volatile memory device. FIG. 6B shows an example mapping table illustrating some example embodiments in which status information is determined according to the number ("quantity") of pages including valid data in the case of FIG. 6A. It is assumed that the memory block BLK0 includes eight pages PG0 to PG7 and a program operation of data is performed in the order of the first page PG0 to the eighth page PG7, and an SPO has occurred while performing the program operation on a sixth page PG5.

Referring to FIGS. 6A and 6B, the recovery module 111 according to some example embodiments of the present disclosure may determine the status information of the first group based on the number ("quantity") of pages including valid data among the pages included in the same memory block (e.g., a first set of pages included in a same memory block) as the reference page in which the program operation at the memory system 10 is interrupted due to the SPO. For example, the reference page may be the sixth page PG5, the status information may be determined based on the number ("quantity") of pages including the valid data among the pages PG0 to PG7 included in the memory block BLK0 which is the same memory block as the sixth page PG5, and whether or not the valid data is included may be determined by referring to the mapping table. In some example embodiments, the mapping table showing a mapping relationship between the physical address and the logical address corresponding to each page of the non-volatile memory device 200 (e.g., a mapping table including information associated with a mapping relationship between a physical address and a logical address corresponding to each page of the plurality of pages of the non-volatile memory device 200) may be stored in the cache memory 130 of the controller 100, and the recovery module 111 may determine the number ("quantity") of pages, among the first set of pages included in the same memory block, including valid data based on referring to the mapping table stored in the cache memory 130. According to some example embodiments, the controller 100 may read the mapping table stored in the meta area of the non-volatile memory device 200 and store it in the cache memory 130, and the recovery module 111 may determine the status information of the first group by referring to the mapping table stored in the cache memory 130.

According to some example embodiments, the mapping table may include information about whether the data stored at a particular address of the memory is valid data (VD) or invalid data (IVD). It is assumed that the first to eighth pages PG0 to PG7 of the memory block BLK0 correspond to logical page addresses LPA_100 to LPA_107, respectively. It is also assumed that the logical page addresses LPA_100 to LPA_107 correspond to physical page addresses PPA_200 to PPA_207, respectively. In some example embodiments, data DT_100, data DT_101 and data DT_102 are stored in the first page PG0, the second page PG1 and the third page PG2, respectively, and data DT_44 and data DT_45 are stored in the fourth page PG3 and the fifth page PG4, respectively.

As shown in FIG. 6B, the mapping table may include valid data (VD) containing data DT_100, data DT_101 and data DT_102 stored in the first page PG0, the second page PG1 and the third page PG2, respectively, and invalid data (IVD) containing data DT_44 and data DT_45 stored in the fourth page PG3 and the fifth page PG4, respectively. That is, it may mean that the data DT_44 and the data DT_45 have been updated to a new location. Due to the characteristics of the non-volatile memory device 200 that data cannot be overwritten on the same page, the updated data may be stored at a location other than a location where the previous data is stored, and instead, the previous data may be represented by the invalid data (IVD).

The recovery module 111 according to some example embodiments of the present disclosure can more efficiently use the memory block by determining the status information based on the number ("quantity") of pages including the valid data (VD). For example, when the number ("quantity") of pages in which the invalid data (IVD) is stored is larger than a particular (or, alternatively, predetermined) reference value, a garbage collection operation is highly likely to be performed. Thus, the number ("quantity") of pages on which a dummy program is to be performed may be set to a high value to prevent new data from being stored.

Although FIG. 6B shows an L2P mapping table in which logical addresses are set as indexes and physical addresses mapped to the logical addresses are set as entries, some example embodiments of the present disclosure is not limited thereto. A P2L mapping table may be applied in which physical addresses are set as indexes and logical addresses mapped to the physical addresses are set as entries.

Figure 7A:
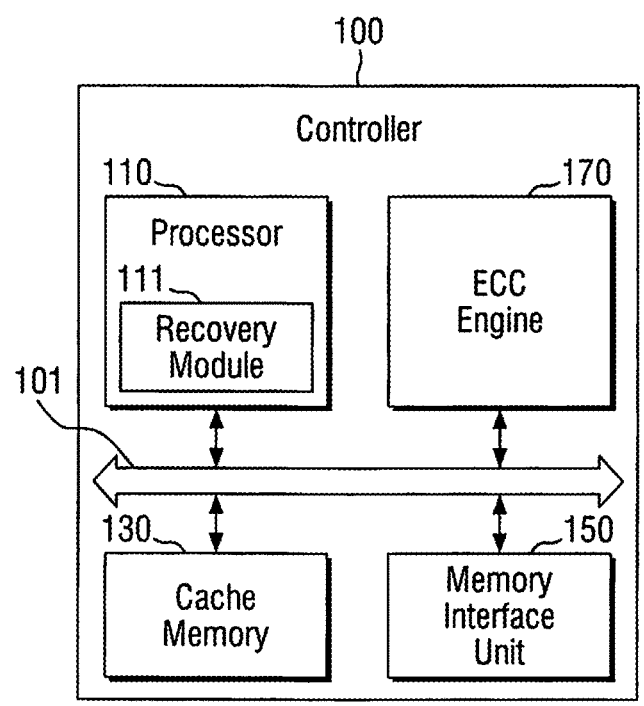
FIG. 7A is a schematic block diagram of a memory system including an ECC engine according to some example embodiments of the present disclosure.
Figure 7B:
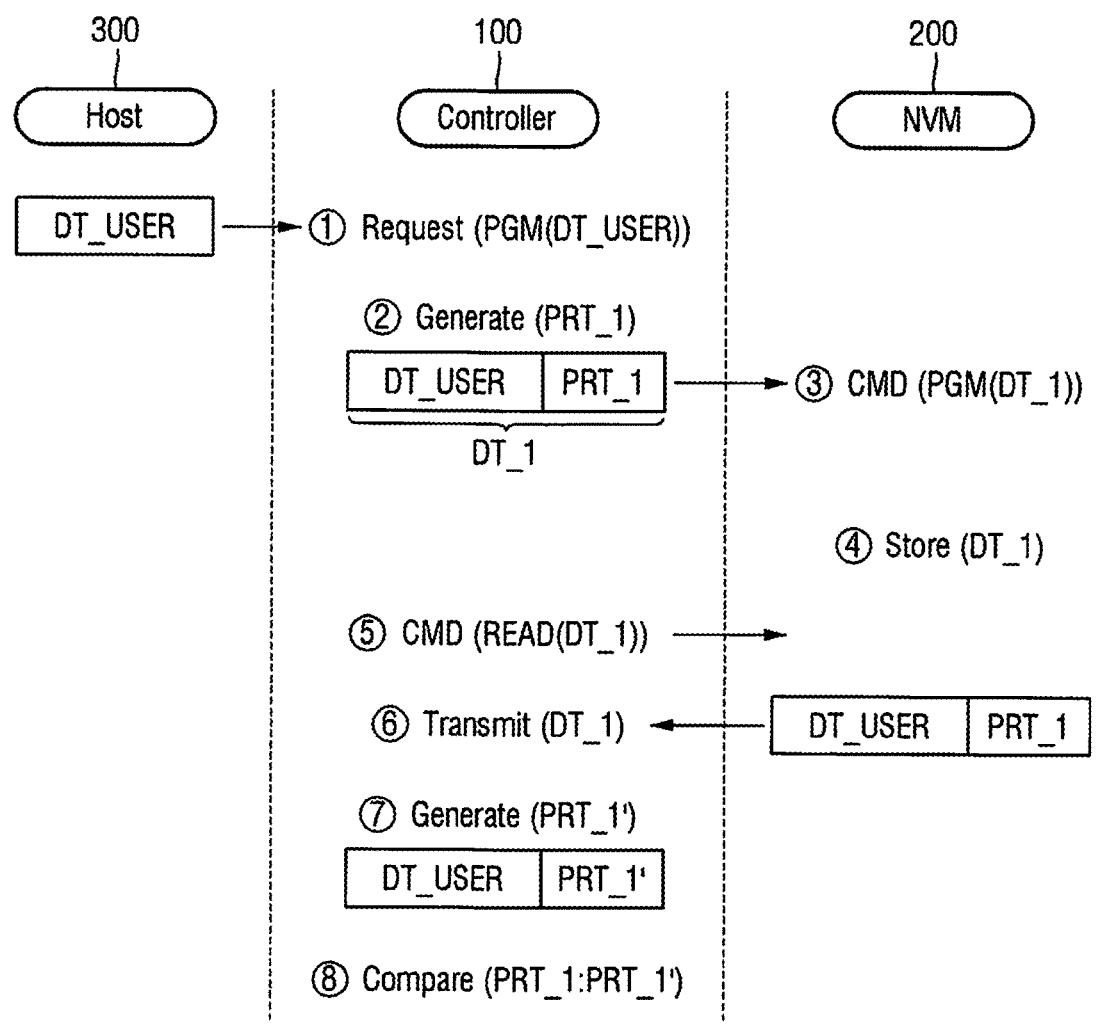
FIG. 7B is a diagram illustrating some example embodiments in which status information is determined based on ECC.

FIG. 7A is a schematic block diagram of a memory system including an ECC engine. FIG. 7B is a diagram illustrating some example embodiments in which status information is determined based on ECC.

Referring to FIG. 7A, the controller 100 according to some example embodiments of the present disclosure may include, in addition to the processor 110, recovery module 111, cache memory 130, and memory interface unit 150 already described herein with reference to FIG. 1, an error correction code (ECC) engine 170. The ECC engine 170 may generate parity data for the data to be transferred to the non-volatile memory device 200. The generated parity data may be stored in the non-volatile memory device 200 together with the data. The ECC engine 170 may detect an error in the data read from the non-volatile memory device 200 based on the parity data. If the detected error is within a correction range, the ECC engine 170 may correct the detected error. The ECC engine 170, which may also be referred to as "ECC circuitry", may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. It will be understood that the controller 100 shown in FIG. 7A may include some or all of the elements shown in FIG. 1 (e.g., the memory 140, the host interface unit 1211, or the like). It will be understood that the controller 100, may include processing circuitry configured to execute a program of instructions stored in a memory device to implement the functionality of the ECC engine 170 as described herein, and such processing circuitry may be the same processing circuitry configured to implement the functionality of one or more other elements of the controller 100, including the recovery module 111.

Referring to FIG. 7B, when receiving a program request PGM(DT_USER) for user data from the host device 300 (①), the ECC engine 170 of the controller 100 may generate parity data PRT_1 for user data DT_USER (②) and transmit, in addition to data DT_1 including a combination of the user data DT_USER and the parity data PRT_1, a program command CMD(PGM(DT_1)) for the data DT_1 to the non-volatile memory device 200 (③). The non-volatile memory device 200 stores the data DT_1 corresponding to the program command CMD(PGM(DT_1)) (④). Thereafter, when the controller 100 transmits a read command CMD(READ(DT_1)) for the data DT_1 to the non-volatile memory device 200 (⑤), the non-volatile memory device 200 transmits the data DT_1 to the controller 100 in response to the CMD(READ(DT_1)) (⑥), and the ECC engine 170 generates parity data PRT_1' based on the user data DT_USER included in the data DT_1 (⑦), and performs an ECC operation by comparing the previously generated parity data PRT_1 with the newly generated parity data PRT_1'(⑧).

The recovery module 111 according to some example embodiments of the present disclosure may determine the status information based on the ECC of the first group. Restated, to perform a recovery operation, the recovery module 111 may determine the status information based on the ECC of the first group. According to some example embodiments, a read operation may be performed on the data included in the first group, an ECC operation may be performed using the parity data generated based on the data received from the non-volatile memory device 200, and status information may be determined based on the number ("quantity") of error bits. For example, if the number ("quantity") of error bits is large, it may be determined that it has been greatly affected by the SPO and the number ("quantity") of pages on which a dummy data program is performed may be set to a large number, and if the number ("quantity") of error bits is small, the number ("quantity") of pages on which a dummy data program is performed may be set to a small number. Accordingly, it will be understood that the recovery module 111, to perform a recovery operation, may perform a read operation of each page included in the first group, acquire ECC parity data from data to be read corresponding to the read operation, and determine the status information based on the acquired ECC parity data.

Figure 8:
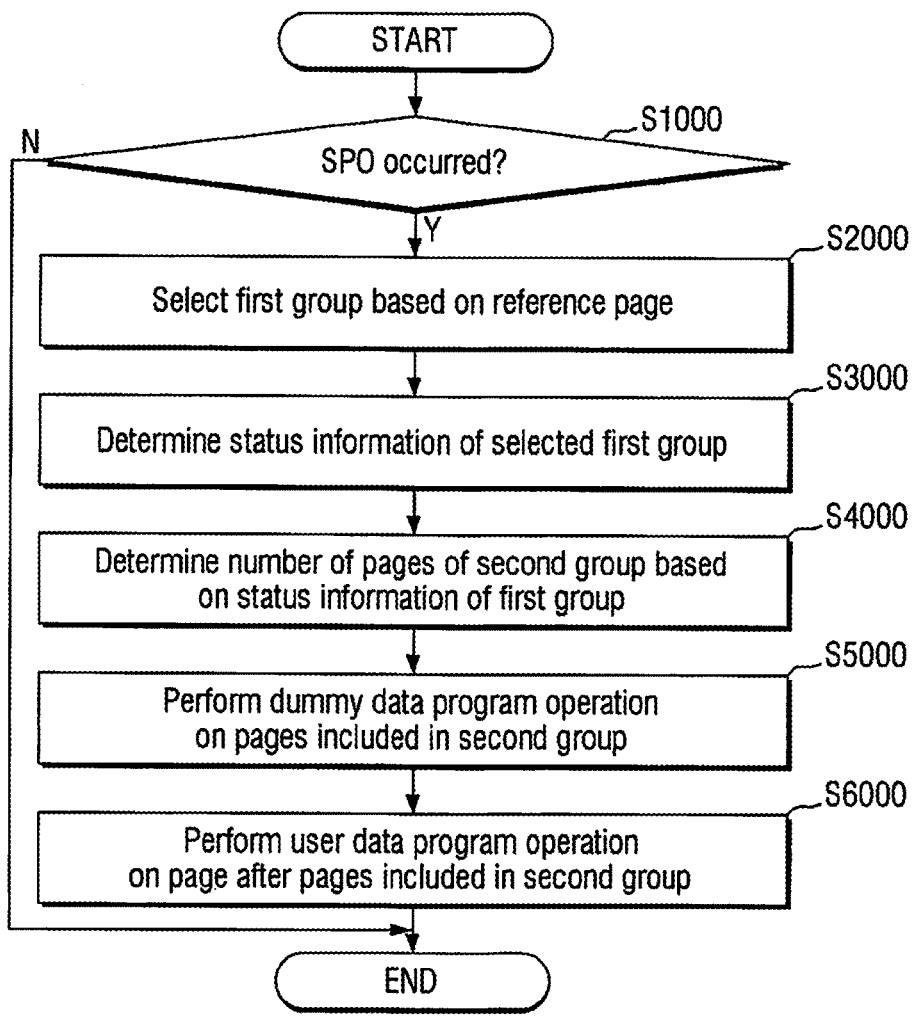
FIG. 8 is a flowchart illustrating some example embodiments in which the number ("quantity") of pages to which dummy data is to be programmed is determined based on the status information.

FIG. 8 is a flowchart illustrating some example embodiments in which the number ("quantity") of pages to which dummy data is to be programmed is determined based on the status information.

In step S1000, it is determined whether or not an SPO has occurred. According to some example embodiments, whether an SPO has occurred may be determined by referring to the meta area of the non-volatile memory device 200. For example, the meta area may store power information indicating a normal power off (NPO), and the power information may be stored in a specific location of the meta area in response to a power off notification issued from the host. If the non-volatile memory device 200 is powered off and the power information stored in the meta area does not indicate the NPO, the controller 100 may determine that an SPO has occurred in the non-volatile memory device 200. In this specification, the occurrence of an SPO in the non-volatile memory device 200 may mean the occurrence of an SPO in a process of performing a program operation on a specific page of the non-volatile memory device 200.

When it is determined that an SPO has occurred in the non-volatile memory device 200, in step S2000, the recovery module 111 of the controller 100 may select the first group based on the reference page of the non-volatile memory device 200. According to some example embodiments, the reference page means a page in which data was being programmed when the SPO occurred and thus may be a page in which a particular program operation is interrupted due to the SPO. The particular program operation may be the same or different in relation to the program operation of the non-volatile memory device 200 during which the SPO occurs. According to some example embodiments, the recovery module 111 may select, as a first group, a page corresponding to a logical address within a particular (or, alternatively, predetermined) range, based on the logical address of the reference page in which a particular program operation is interrupted due to the SPO. In some example embodiments, to perform a recovery operation, the recovery module 111 may select the first group based on a mapping table representing a mapping relationship between a physical address and a logical address corresponding to each page of the plurality of pages included in the non-volatile memory device 200.

In step S3000, the status information of the selected first group may be determined. The status information according to some example embodiments described with reference to FIGS. 3 to 7B may be applied. According to some example embodiments, the status information may be determined based on the temperature information of the reference page. In some example embodiments, the temperature information may include the temperature of the reference page at the time when the SPO occurred. Restated, to perform a recovery operation, the recovery module 111 may determine the status information based on based on temperature information of a reference page in which a particular program operation is interrupted due to the specific event, where the temperature information includes a temperature of the reference page at a time concurrent with occurrence of the specific event (e.g., the time when the specific event occurred).

According to some example embodiments, the status information may include a combination of a plurality of determination conditions. For example, a plurality of levels may be set by combining one or more determination conditions of a threshold voltage distribution of a particular set of memory cells included in the first group, an erase count of a particular memory block including the first group, a read count of a memory block including the first group, the number ("quantity") of valid pages of a memory block including a reference page in which a particular program operation is interrupted, temperature information associated with the first group, or any combination thereof, status information corresponding to each level may be defined, and the number ("quantity") of pages of the second group corresponding to each status information may be determined.

It will be understood that, to perform a recovery operation, in some example embodiments, the recovery module 111 may determine the status information based on a threshold voltage distribution of memory cells including the first group, an erase count of a particular memory block including the first group, a read count of a memory block including the first group, the quantity of valid pages of a memory block including a reference page in which a particular program operation is interrupted, temperature information of the first group, or any combination thereof.

In step S4000, the number ("quantity") of pages of the second group may be determined based on the status information of the first group. In some example embodiments, the second group may mean pages on which a dummy data program is to be performed. In step S5000, a dummy data program operation may be performed on the pages included in the second group. In step S6000, a user data program operation may be performed on a page after the pages included in the second group. In some example embodiments, the user data program may mean an operation of storing the user data corresponding to a program request of the host device 300 in the non-volatile memory device 200.

According to some example embodiments of the present disclosure, when an SPO occurs, the first group is set based on the reference page, the second group is selected based on the status information of the first group, and a dummy data program operation is performed on the selected second group. Accordingly, it is possible to increase a reuse ratio for the memory block in which the SPO occurs and improve the usability of the non-volatile memory device 200 by dynamically applying the condition of the dummy data program in accordance with the status information about the adjacent page or the particular (or, alternatively, predetermined) page.

FIG. 9 is a diagram illustrating some example embodiments in which a verify voltage level of a dummy data program is determined based on status information.

Referring to FIGS. 1, 2 and 9, the recovery module 111 according to some example embodiments of the present disclosure, to perform a recovery operation for the non-volatile memory device 200 in response to a determination that a sudden power off (SPO) occurs during a program operation of the non-volatile memory device 200, may determine status information of ("associated with") a first group including at least one page of the plurality of pages, determine a program condition of ("associated with") dummy data to be programmed in a second group based on the status information of the first group, and perform a dummy data program operation on one or more pages included in the second group in accordance with the determined dummy data program condition. The page of the first group may be a page on which determination of status information is performed, and the page of the second group may be a page on which a dummy program operation is performed. In some example embodiments, to perform the recovery operation, the recovery module 111 may program the dummy data in each page included in the second group based on the program condition. For simplicity of description, a description overlapping with the description with reference to FIGS. 1 to 3 will be omitted.

It will be understood that, as described herein, a "level" of a voltage, a voltage "level," or the like refers to a "magnitude" of the voltage.

According to some example embodiments, the dummy data program condition may mean the level of a verify voltage applied to the dummy data program. As shown, a verify voltage level of the dummy data program corresponding to each of a plurality of pieces status information may be set and, thus, the dummy data program condition may be determined. In some example embodiments, the status information means status information of the first group, and the verify voltage level means a voltage level of a verify voltage applied to the dummy data program operation.

For example, when it is determined that the first group has first status information INF_Status(1), the verify voltage level of the dummy data program for the second group on which the dummy program operation is to be performed may be determined as a verify voltage Vvrf_1. In some example embodiments, when it is determined that the first group has second to fourth status information INF_Status(2), INF_Status(3) and INF_Status(4), a verify voltage level Vvrf_2, a verify voltage level Vvrf_3 and a verify voltage level Vvrf_4 may be determined as the verify voltage level of the dummy data program.

Figure 10A:
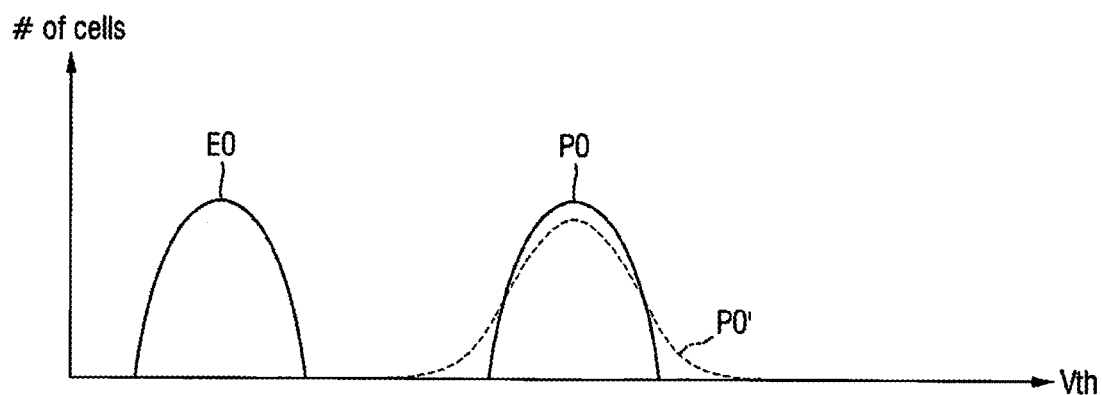
FIGS. 10A and 10B show an example threshold voltage distribution of a memory cell to explain some example embodiments in which the level of the verify voltage is variably applied based on the status information.
Figure 10B:
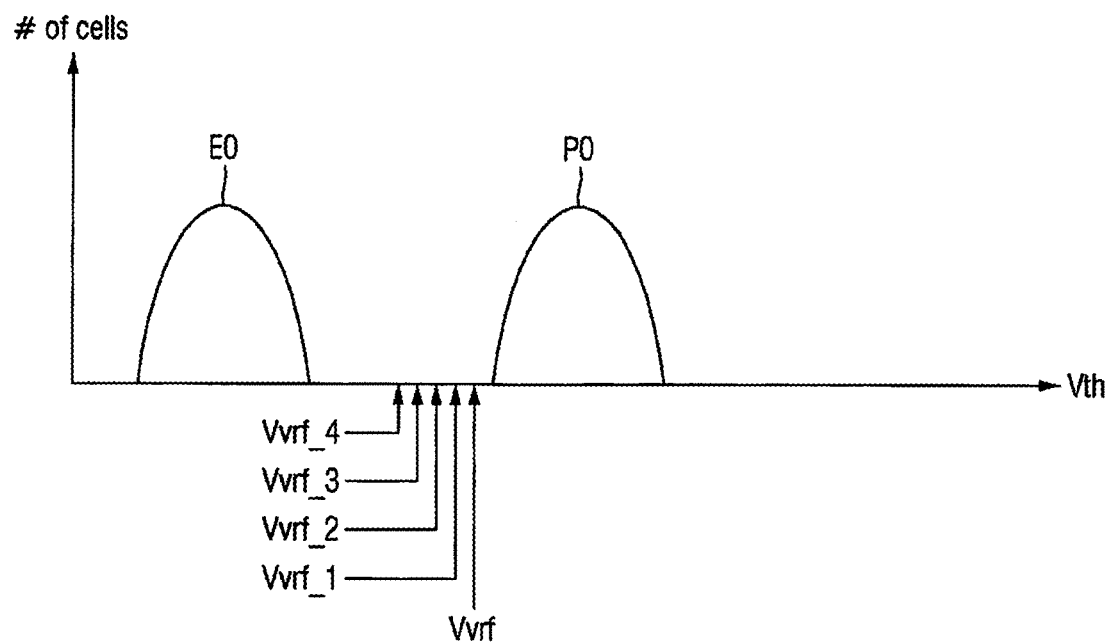

FIGS. 10A and 10B show an example threshold voltage distribution of a memory cell to explain some example embodiments in which the level of the verify voltage is variably applied based on the status information.

When an SPO occurs, the power supply is suddenly interrupted and the program in progress is interrupted without being completed. The threshold voltage distribution of the cells connected to the page (or word line), in which the SPO occurs, remains in a soft program state that is neither an erase state nor a program state. In some example embodiments, the threshold voltage distribution of the page adjacent to the reference page in which the program is interrupted due to the SPO may be changed under the influence of the reference page. FIG. 10A shows a threshold voltage distribution of the page adjacent to the reference page before and after occurrence of an SPO, which may be changed from a program state P0 to a program state P0'. Accordingly, when the verify voltage applied to the program state P0 is applied, the number ("quantity") of error bits may increase. Thus, the program time increases or some example embodiments where it is determined that the program fails occurs increasingly.

Referring to FIGS. 9 and 10B, it may mean that the damage degree of the first group deteriorates as it goes from the first status information INF_Status(1) to the fourth status information INF_Status(4). When the program verify voltage before the occurrence of the SPO is a verify voltage Vvrf, if the degree of damage is not severe (for example, when the status information of the first group is determined as the first status information INF_Status(1)), the verify voltage level applied to the dummy data program is determined as a value of a relatively high voltage level (e.g., a verify voltage Vvrf_1), and if it is determined that the degree of damage is severe (for example, when the status information of the first group is determined as the fourth status information INF_Status(4)), the verify voltage level applied to the dummy data program is determined as a value of a relatively low voltage level (e.g., a verify voltage Vvrf_4). Therefore, the page to be used can be flexibly applied according to the status of the cell of the memory, and the efficiency of use of the memory can be increased.

In some example embodiments, to perform a recovery operation, the recovery module 111 may variably apply, based on the status information, a level ("magnitude") of a program operation voltage applied to a program operation of the dummy data, a time of applying the program operation voltage, a level ("magnitude") of a verify voltage, or any combination thereof.

In some example embodiments, perform a recovery operation, the recovery module 111 may, in response to a determination that a page included in the second group stores two or more bits per memory cell, select levels ("magnitudes") of separate, respective program operation voltages of a plurality of program operation voltages applied to the program operation of the dummy data, times of applying the separate, respective program operation voltages, levels ("magnitudes") of separate, respective verify voltages of a plurality of verify voltages, or any combination thereof, and variably apply each of the selected levels and/or times.

According to some example embodiments, when the degree of damage of the first group exceeds a particular (or, alternatively, predetermined) range, a reference memory block including the reference page may be set as a bad block without performing a dummy data program operation on the second group, and a program operation of data for the remaining pages of the reference memory block may be blocked. For example, when the status information of the first group is determined as the fifth status information INF_Status(5), the recovery module 111 may not select the verify voltage level applied to the dummy data program, and may set the reference memory block including the reference page in which the SPO has occurred as a bad block.

Figure 11:
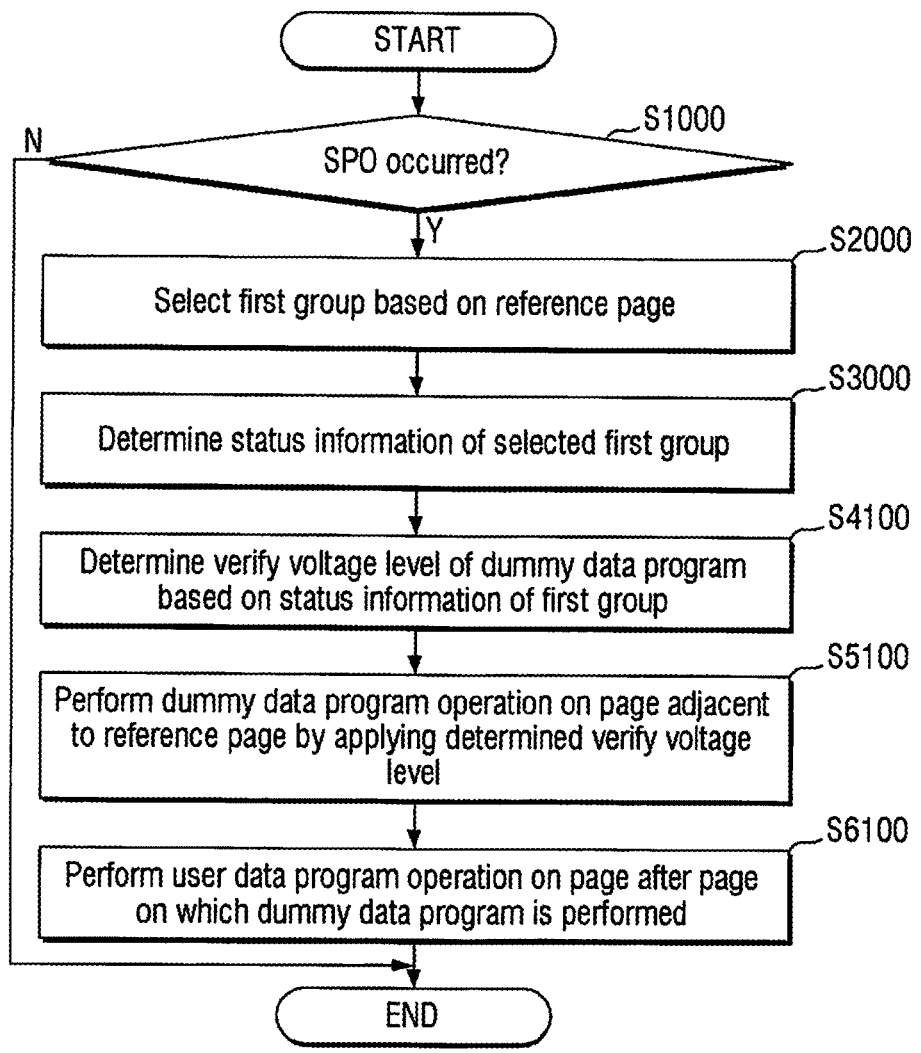
FIG. 11 is a flowchart illustrating some example embodiments in which a verify voltage level of a dummy data program is determined based on status information.

FIG. 11 is a flowchart illustrating some example embodiments in which a verify voltage level of a dummy data program is determined based on status information. Steps S1000 to 53000 described with reference to FIG. 8 may be similarly applied to steps S1000 to S3000 of FIG. 11.

In step S4100, the recovery module 111 may determine the verify voltage level of the dummy data program based on the status information of the first group. In step S5100, a dummy program operation may be performed on the page adjacent to the reference page in which the program operation is interrupted due to the occurrence of the SPO by applying the verify voltage level determined in step S4100. In some example embodiments, the determination condition of the adjacent page and the page number may be set before the occurrence of the SPO. In step S6100, a user data program operation may be performed on a page after the page, on which the dummy data program is performed.

Figure 12:
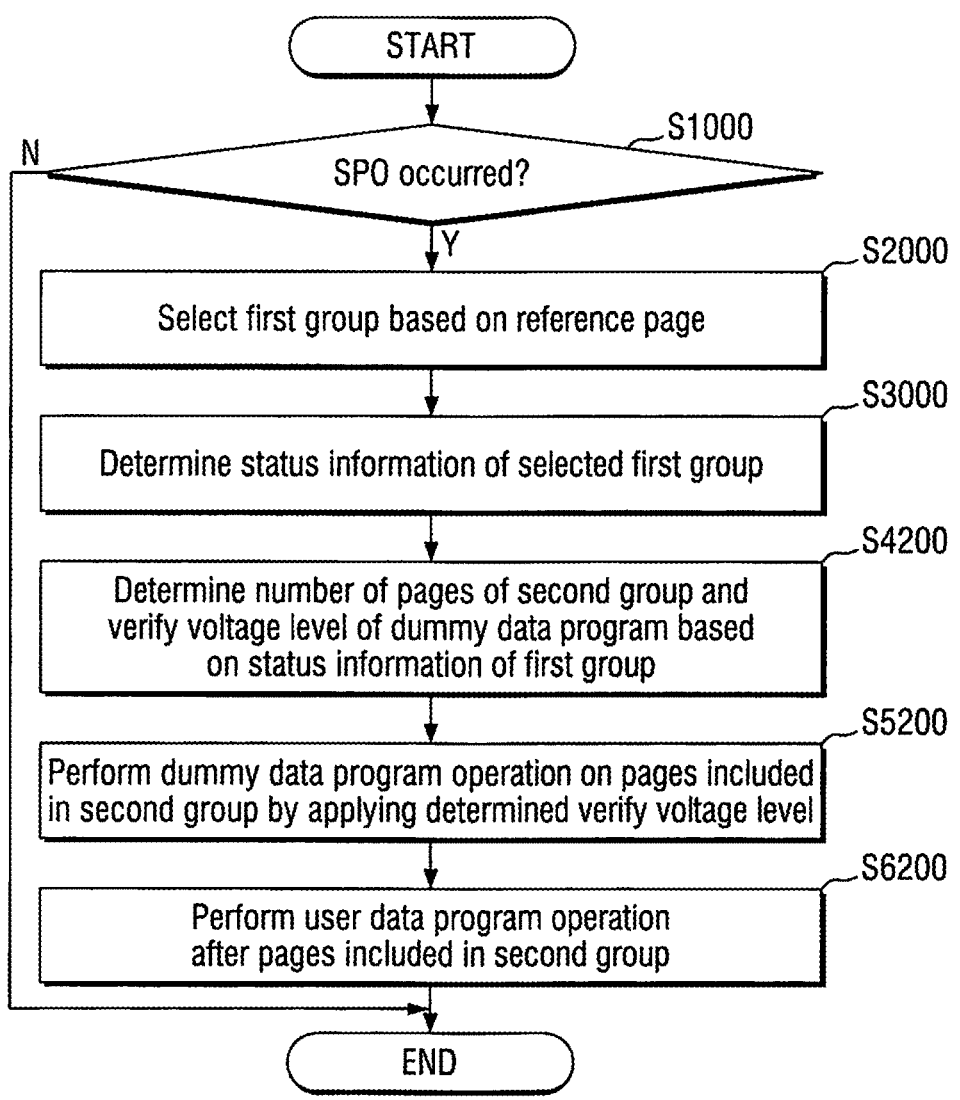
FIG. 12 is a flowchart illustrating some example embodiments in which the number ("quantity") of pages to which dummy data is to be programmed and a verify voltage level of a dummy data program are determined based on status information.

FIG. 12 is a flowchart illustrating some example embodiments in which the number ("quantity") of pages to which dummy data is to be programmed and a verify voltage level of a dummy data program are determined based on status information. Steps S1000 to S3000 described with reference to FIG. 11 may be similarly applied to steps S1000 to S3000 of FIG. 12.

In step S4200, the number ("quantity") of pages of the second group and the verify voltage level of the dummy data program may be determined based on the status information of the first group. That is, an operation of determining the number ("quantity") of pages of the second group based on the status information and an operation of determining the verify voltage level of the dummy data program based on the status information may be applied simultaneously. In step S5200, a dummy data program operation is performed on the pages included in the second group by applying the determined verify voltage level. In step S6200, a user data program operation may be performed on a page after the pages included in the second group.

Figure 13:
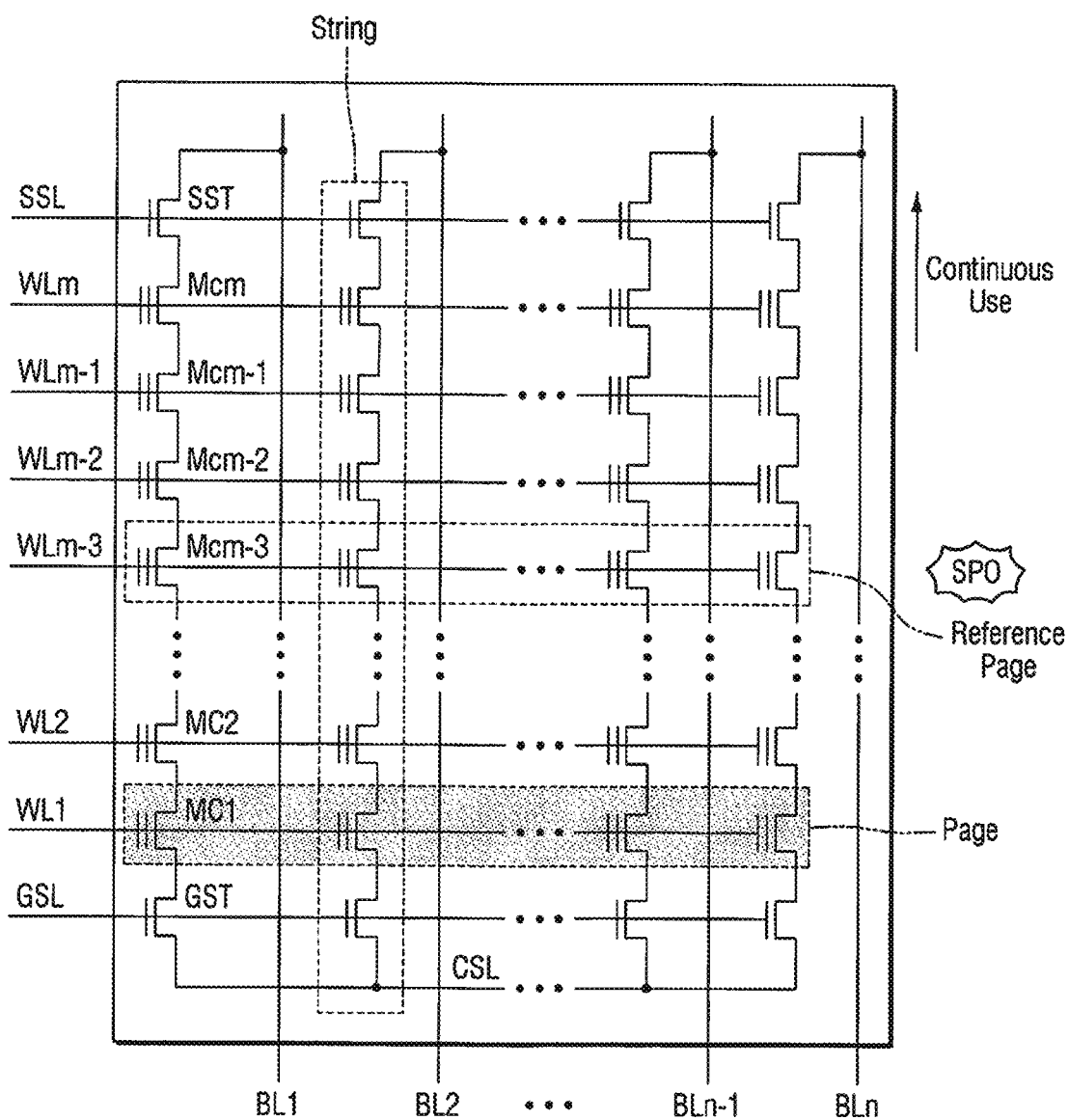
FIG. 13 is a diagram illustrating some example embodiments in which a target group is determined based on arrangement information of word lines.

FIG. 13 is a diagram illustrating some example embodiments in which a target group is determined based on arrangement information of word lines.

Referring to FIG. 13, a memory block (e.g., BLK0 of FIG. 1) includes strings connected to a plurality of bit lines BL1 to BLn (n is an integer of 2 or more). Each of the strings includes at least one string select transistor SST connected in series between a bit line and a common source line CSL, a plurality of memory cells MC1 to MCm (m is an integer of 2 or more), and at least one ground select transistor GST. Each of the memory cells MC1 to MCm may store data of at least one bit.

A plurality of memory cells may be connected to each of word lines WL1 to WLm. A plurality of memory cells connected to each of the word lines WL1 to WLm are collectively referred to as a page. Word line voltages (program voltage, pass voltage, read voltage, read pass voltage, etc.) necessary for driving may be applied to each of the word lines WL1 to WLm. A string select voltage for controlling the string select transistor SST may be applied to a string select line SSL. A ground select voltage for controlling the ground select transistor GST may be applied to a ground select line GSL.

Hereinafter, it is assumed that an SPO has occurred during a program operation on a page (reference page) connected to a word line WLm-3.

Figure 14:
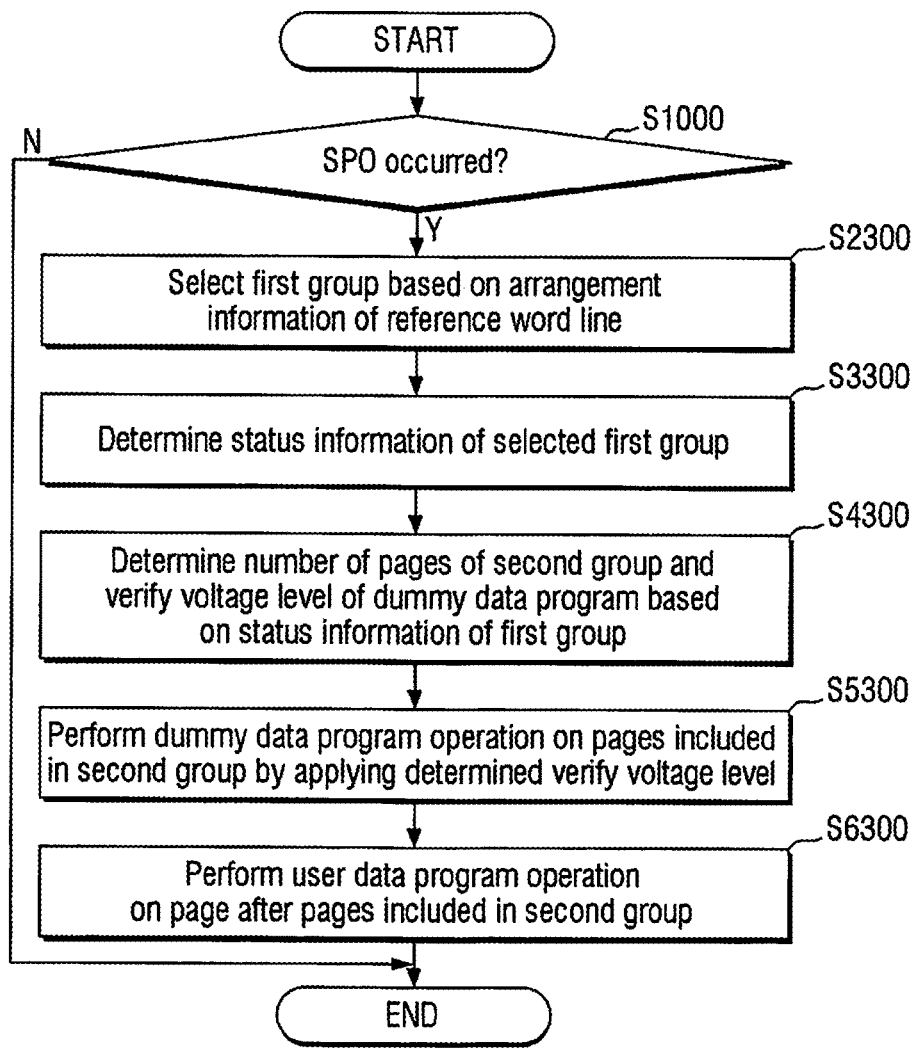
FIG. 14 is a flowchart illustrating some example embodiments in which a first group on which determination of status information is to be performed is selected based on arrangement information of a reference word line.

FIG. 14 is a flowchart illustrating some example embodiments in which a first group on which determination of status information is to be performed is selected based on arrangement information of a reference word line in which a particular program operation is interrupted due to an SPO. The arrangement information, as described herein, may the stored in a cache memory 130. In step S1000, the same operation as in step S1000 of FIG. 8 may be performed.

Referring to FIGS. 13 and 14, in step S2300, the recovery module 111 according to some example embodiments of the present disclosure may select the first group based on the arrangement information of the reference word line in which a particular program operation is interrupted due to an SPO. The arrangement information of the reference word line may mean physical position information on which the reference word line is arranged on a semiconductor chip. That is, the recovery module 111 may select page(s) corresponding to a particular (or, alternatively, predetermined) number ("quantity") of adjacent word lines as the first group. For example, if it is set to configure the first group with two adjacent word lines, a page corresponding to a word line WLm-2 and a page corresponding to a word line WLm-4 may be selected as the first group.

In steps S4300, S5300 and S6300, the same operations as in steps S4200, S5200, and S6200 of FIG. 12 may be performed, respectively.

Figure 15:
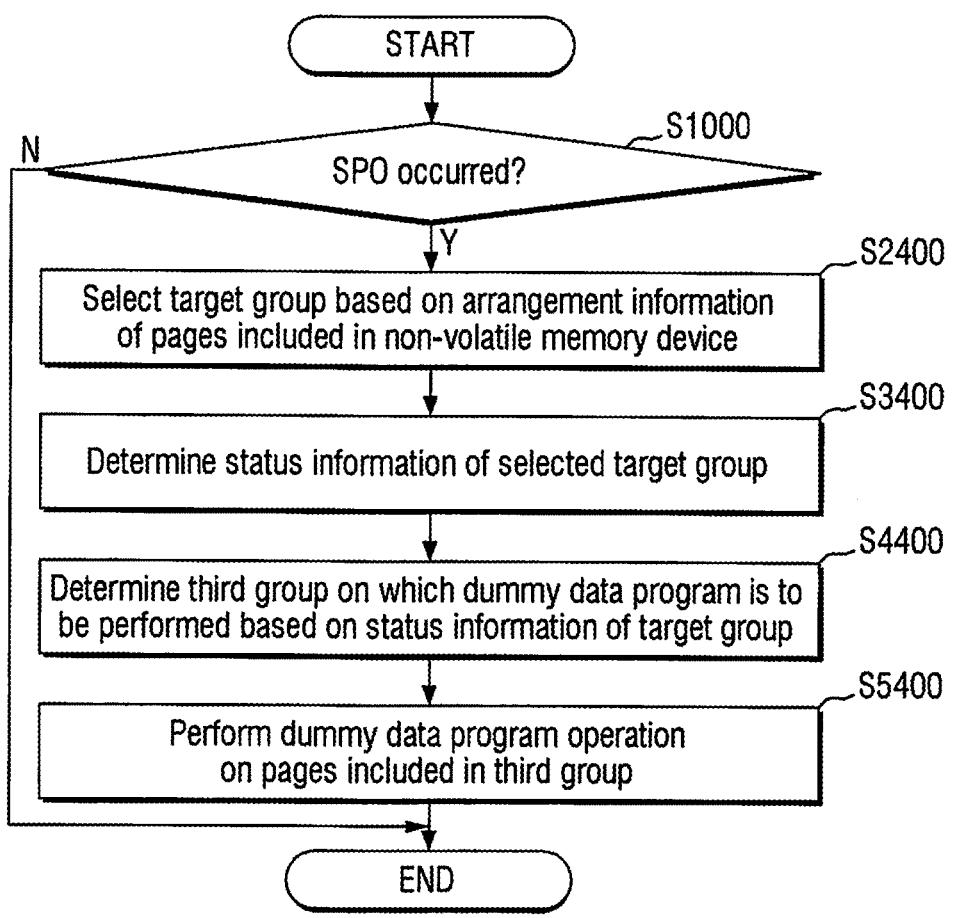
FIG. 15 is a flowchart illustrating some example embodiments in which a target group is selected based on arrangement information of pages included in the non-volatile memory device.

FIG. 15 is a flowchart illustrating some example embodiments in which a target group is selected based on arrangement information of each page of the plurality of pages included in the non-volatile memory device 200. In step S1000, the same operation as in step S1000 of FIG. 8 may be performed.

In step S2400, the recovery module 111 according to some example embodiments of the present disclosure may select the target group based on the arrangement information of the pages included in the non-volatile memory device 200. In some example embodiments, the recovery module 111 may select the target group based on the arrangement information associated with each page of the plurality of pages arranged on a semiconductor chip of the non-volatile memory device 200. The arrangement information, as described herein, may the stored in a cache memory 130. In some example embodiments, the recovery module 111, to perform a recovery operation, may determine the target group based on arrangement information obtained based on accessing the cache memory 130. In some example embodiments, the target group refers to an object for which status information is determined. The recovery module 111 may select the target group based on the physical arrangement of the word lines of the non-volatile memory device 200 regardless of a reference page in which a particular program operation is interrupted during an SPO process. As described herein, a particular program operation that may be interrupted during a specific event, including an SPO, may be the same or different in relation to the program operation of the non-volatile memory device 200 during which the specific event occurs, where the recovery module 111 may perform a recovery operation for the non-volatile memory device 200 in response to a determination that the specific event has occurred at the memory system 10 during the program operation of the non-volatile memory device 200. In a large number ("quantity") of memory cells mounted on the semiconductor chip, the characteristics such as the life time of the memory cell may be determined depending on the position on the semiconductor chip as well as the characteristics of the cell itself. For example, a memory cell adjacent to a large number ("quantity") of word lines in the arrangement may be highly influenced by a voltage applied to adjacent cells, and thus, a read disturb may occur excessively. As another example, a word line located at the edge of the semiconductor chip may be highly influenced by an environmental factor such as temperature. Therefore, a list of word lines which may be highly influenced by the surroundings due to physical arrangement characteristics as well as the word line corresponding to the reference page when an SPO occurs in the non-volatile memory device 200 may be generates in advance, and when the SPO occurs, the target group may be determined based on the generated list.

In step S3400, status information of the selected target group may be determined. According to some example embodiments, the determined status information may be the same as the status information described with reference to FIGS. 3 to 8.

In step S4400, a third group on which a dummy data program is to be performed may be determined based on the status information of the target group. According to some example embodiments, the third group may be the same as the second group described with reference to FIGS. 3 to 8. That is, the third group may be determined based on the reference page. The third group may include at least one page of the plurality of pages of the non-volatile memory device 200. According to some example embodiments, the third group may be determined based on the target group. For example, a page corresponding to a word line adjacent to a word line included in the target group may be determined as the third group. In some example embodiments, the recovery module 111 may select the third group based on the arrangement information associated with each page of the plurality of pages arranged on a semiconductor chip of the non-volatile memory device 200. In some example embodiments, the recovery module 111 may select the third group or the target group based on the arrangement information associated with each page of the plurality of pages arranged on a semiconductor chip of the non-volatile memory device 200. In some example embodiments, the third group may be determined based on status information of the target group. In step S5400, a dummy data program operation may be performed on one or more pages included in the third group. The performing of the dummy data program operation may include programming dummy data on one or more pages of the third group, based on status information of the target group. Accordingly, in some example embodiments, the performing of the dummy data program operation may include programming dummy data on one or more pages of the third group, based on status information of the target group, may be in response to a determination that a sudden power off (SPO) occurs during a program operation of the non-volatile memory device 200.

In concluding the detailed description, those skilled in the art will appreciate that many variations and modifications may be made to some example embodiments without substantially departing from the principles of the present inventive concepts. Therefore, the disclosed example embodiments of the inventive concepts are used in a generic and descriptive sense only and not for purposes of limitation.

What is claimed is:

1. A memory system, comprising:
   a non-volatile memory device including an array of memory cells, the array including a plurality of memory blocks and a plurality of pages, each separate memory block of the plurality of memory blocks including a separate, respective set of one or more pages of the plurality of pages; and
   controller circuitry configured to control an operation of the non-volatile memory device, the controller circuitry including
   processing circuitry configured to perform a recovery operation for the non-volatile memory device in response to a determination that a specific event has occurred at the memory system during a program operation of the non-volatile memory device, the performing a recovery operation including
   determining status information associated with a first group including at least one page of the plurality of pages,
   determining a quantity of a particular set of pages, of the plurality of pages, included in a second group based on the status information associated with the first group, and
   programming dummy data for one or more pages, of the particular set of pages included in the second group.

2. The memory system of claim 1, wherein the performing a recovery operation includes selecting, as the first group, a selected page, of the plurality of pages, corresponding to a logical address within a particular range based on a logical address of a reference page, of the plurality of pages, in which the program operation of the memory system is interrupted due to the specific event.

3. The memory system of claim 1, wherein the performing a recovery operation includes
   applying at least one read voltage to each page, of the plurality of pages, included in the first group,
   determining a threshold voltage distribution associated with a memory cell, of the array of memory cells, included in the first group based on information obtained based on applying the read voltage, and determining the status information associated with the first group based on the threshold voltage distribution associated with the memory cell.

4. The memory system of claim 1, wherein the performing a recovery operation includes determining the status information associated with the first group based on
an erase count of a particular memory block, of the plurality of memory blocks, including the first group,
a read count of the particular memory block including the first group, or
both the erase count and the read count.

5. The memory system of claim 1, wherein the performing a recovery operation includes determining the status information associated with the first group based on a quantity of pages including valid data among a first set of pages included in a same memory block as a reference page in which the program operation of the memory system is interrupted due to the specific event.

6. The memory system of claim 5, wherein
the controller circuitry further includes cache memory circuitry storing a mapping table including information associated with a mapping relationship between a physical address and a logical address corresponding to each page of the plurality of pages of the non-volatile memory device, and
the performing a recovery operation includes determining the quantity of pages including the valid data based on referring to the mapping table.

7. The memory system of claim 1, wherein
the performing a recovery operation includes determining the status information based on temperature information of a reference page in which a particular program operation is interrupted due to the specific event, and
the temperature information includes a temperature of the reference page at a time concurrent with occurrence of the specific event.

8. The memory system of claim 1, wherein the performing a recovery operation includes determining the status information based on an error correction code (ECC) of the first group.

9. The memory system of claim 8, wherein the performing a recovery operation includes
performing a read operation on each page included in the first group,
acquiring ECC parity data from data to be read corresponding to the read operation, and
determining the status information based on the acquired ECC parity data.

10. The memory system of claim 1, wherein the performing a recovery operation includes determining the status information based on
a threshold voltage distribution associated with a particular set of memory cells included in the first group,
an erase count of a particular memory block, of the plurality of memory blocks, including the first group,
a read count of the particular memory block including the first group,
a quantity of valid pages of a memory block including a reference page in which a particular program operation is interrupted,
temperature information associated with the first group, or
any combination thereof.

11. The memory system of claim 1, wherein the specific event is a sudden power off (SPO) of the non-volatile memory device.

12. A memory system, comprising:
a non-volatile memory device including an array of memory cells, the array including a plurality of memory blocks and a plurality of pages, each separate memory block of the plurality of memory blocks including a separate, respective set of one or more pages of the plurality of pages; and
controller circuitry configured to control an operation of the non-volatile memory device, the controller circuitry including
processing circuitry configured to perform a recovery operation for the non-volatile memory device in response to a determination that a sudden power off (SPO) occurs during a program operation of the non-volatile memory device, the performing a recovery operation including
determining status information associated with a first group including at least one page of the plurality of pages,
determining a program condition associated with dummy data to be programmed in a second group based on the status information associated with the first group, and
programming the dummy data in one or more pages included in the second group based on the program condition.

13. The memory system of claim 12, wherein the performing a recovery operation includes selecting the first group based on a mapping table representing a mapping relationship between a physical address and a logical address corresponding to each page of the plurality of pages included in the non-volatile memory device.

14. The memory system of claim 13, wherein the performing a recovery operation includes selecting, as the first group, a page corresponding to a logical address within a particular range based on a logical address of a reference page in which a particular program operation is interrupted due to the SPO.

15. The memory system of claim 12, wherein the performing a recovery operation includes variably applying, based on the status information,
a magnitude of a program operation voltage applied to a program operation of the dummy data,
a time of applying the program operation voltage,
a magnitude of a verify voltage, or
any combination thereof.

16. The memory system of claim 15, wherein the performing a recovery operation includes, in response to a determination that a page included in the second group stores two or more bits per memory cell,
selecting
magnitudes of separate, respective program operation voltages applied to the program operation of the dummy data,
times of applying the separate, respective program operation voltages,
magnitudes of separate, respective verify voltages, or any combination thereof, and
variably applying each of the selected magnitudes and/or times.

17. The memory system of claim 12, wherein the performing a recovery operation includes determining a quantity of pages included in the second group based on the status information.

18. A memory system, comprising:
a non-volatile memory device including an array of memory cells, the array including a plurality of memory blocks and a plurality of pages, each separate memory block of the plurality of memory blocks including a separate, respective set of one or more pages of the plurality of pages; and controller circuitry configured to control an operation of the non-volatile memory device, the controller circuitry including processing circuitry configured to perform a recovery operation based on programming dummy data in a first group including at least one page of the plurality of pages, based on status information of a target group, in response to a determination that a sudden power off (SPO) occurs during a program operation of the non-volatile memory device, the performing a recovery operation including determining the target group or the first group based on arrangement information associated with each page of the plurality of pages arranged on a semiconductor chip of the non-volatile memory device.

19. The memory system of claim 18, wherein the performing a recovery operation includes determining the target group based on arrangement information associated with a reference word line in which a particular program operation is interrupted due to the SPO.

20. The memory system of claim 18, wherein the controller circuitry further includes cache memory circuitry storing the arrangement information, and the performing a recovery operation includes determining the target group based on the arrangement information obtained based on accessing the cache memory circuitry.

* * * * *